(12) United States Patent
Bacigalupo

(10) Patent No.: US 8,990,466 B2
(45) Date of Patent: Mar. 24, 2015

(54) ARBITER FOR ASYNCHRONOUS STATE MACHINES

(75) Inventor: Tommaso Bacigalupo, Fuerstenfeldbruck (DE)

(73) Assignee: Infineon Technologies Austria AG, Villach (AT)

( * ) Notice: Subject to any disclaimer, the term of this patent is extended or adjusted under 35 U.S.C. 154(b) by 363 days.

(21) Appl. No.: 13/482,753

(22) Filed: May 29, 2012

(65) Prior Publication Data

US 2013/0326100 A1 Dec. 5, 2013

(51) Int. Cl.
G06F 13/36 (2006.01)
G06F 13/366 (2006.01)
H03K 19/00 (2006.01)

(52) U.S. Cl.
CPC ............. G06F 13/366 (2013.01); H03K 19/00 (2013.01)
USPC ........................................... 710/240

(58) Field of Classification Search
CPC .................................................... G06F 13/366
USPC ................................. 710/240–244
See application file for complete search history.

(56) References Cited

U.S. PATENT DOCUMENTS

| | | | | |
|---|---|---|---|---|
| 5,241,541 A * | 8/1993 | Farrell et al. | .................. | 370/438 |
| 5,404,556 A | 4/1995 | Mahowald et al. | | |
| 5,594,876 A * | 1/1997 | Getzlaff et al. | ............... | 710/113 |
| 6,424,655 B1 * | 7/2002 | Horst | ............................ | 370/412 |
| 6,868,529 B1 * | 3/2005 | Frannhagen | .................. | 709/225 |
| 7,110,360 B1 * | 9/2006 | Hui et al. | ...................... | 370/235 |
| 7,395,360 B1 * | 7/2008 | Pritchard et al. | .............. | 710/113 |
| 2005/0182878 A1 * | 8/2005 | Lehongre | ...................... | 710/240 |
| 2009/0024777 A1 * | 1/2009 | Hirotsu et al. | ................ | 710/116 |
| 2011/0121857 A1 | 5/2011 | Nowick et al. | | |

OTHER PUBLICATIONS

Sutherland, I., "Turning Award; Micropipelines," Communications of the ACM, vol. 32, No. 6, Jun. 1989, pp. 720-738.
Hauck, S., "Asynchronous Design Methodologies: An Overview," Proceedings of the IEEE, vol. 83, No. 1, Jan. 1995, pp. 69-93.
Sparsø, J., ed., "Mutual Exclusion, arbitration and metastability," Principles of Asynchronous Circuit Design—A Systems Perspective, Section 5.8, 2001, 354 pages, Kluwer Academic Publishers.
Mullins, R. et al., "Demystifying Data-Driven and Pausible Clocking Schemes," 13th IEEE International Symposium on Asynchronous Circuits and Systems (ASYNC'07), Mar. 2007, 11 pages.
"C-element," Wikipedia, http://en.wikipedia.org/wiki/C-element, dated Oct. 15, 2013, 3 pgs.

* cited by examiner

*Primary Examiner* — Paul R Myers
(74) *Attorney, Agent, or Firm* — Slater & Matsil, L.L.P.

(57) ABSTRACT

An arbiter can be used for processing a plurality of asynchronous data signals. Each data signal is associated with a request signal and a respective acknowledge signal. The arbiter includes a latch array with an input coupled to receive the data signals and request signals and an output coupled to provide a data vector and a validity vector. The data vector includes values depending on the data signals and the validity vector includes values depending on the request signals when the latch array is in a transparent state. Logic circuitry is configured to trigger the latch array when any of the request signals becomes active, to activate a global request signal a delay time after the latch has been triggered, and to selectively activate the acknowledge signals for a channel or channels for which an active request signal has been latched.

16 Claims, 4 Drawing Sheets

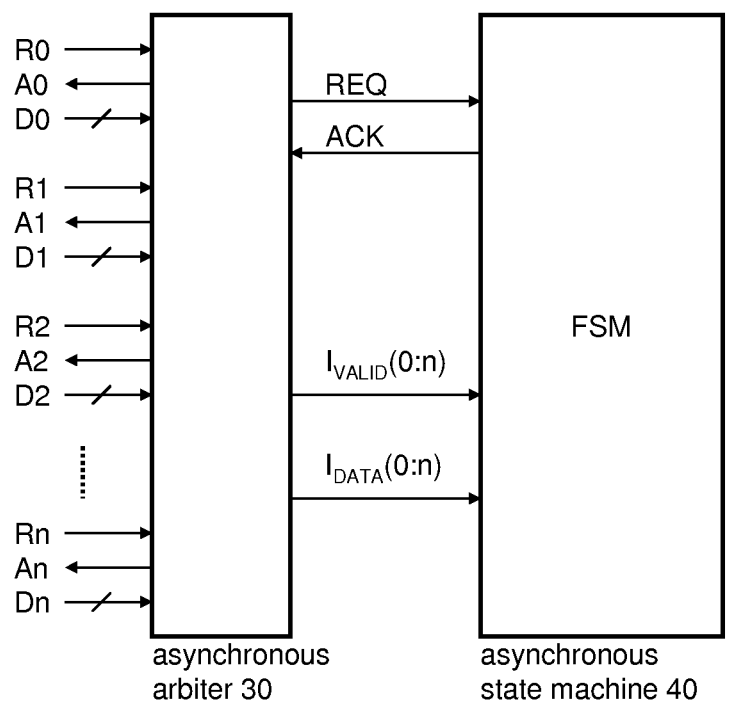
FIG. 4
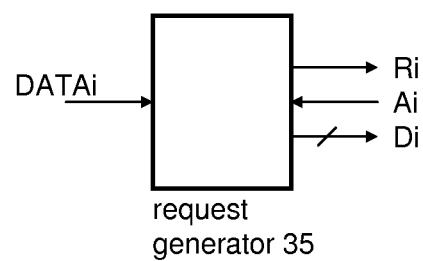
FIG. 5  (i = 0, 1, 2, ..., n)

ARBITER FOR ASYNCHRONOUS STATE MACHINES

TECHNICAL FIELD

The present invention generally relates to the field of asynchronous circuit design. More particular the invention relates to arbiters for handling multiple (almost) simultaneously switching inputs and the application of such arbiters in asynchronous state machines.

BACKGROUND

Most digital circuits designed and fabricated today are "synchronous." In essence, synchronous circuits are based on two fundamental assumptions that greatly simplify their design: (1) all signals are binary, and (2) all components share a common and discrete notion of time, as defined by a clock signal distributed throughout the circuit.

Asynchronous circuits are fundamentally different. They also assume binary signals, but there is no common and discrete time. Instead the circuits use handshaking between their components in order to perform the necessary synchronization, communication, and sequencing of operations. Expressed in terms usually used with regard to synchronous circuits this results in a behaviour that is similar to a systematic fine-grain clock gating and local clocks that are not in phase and whose periods are determined by actual circuit delays. This difference gives asynchronous circuits inherent properties that may be advantageous (with respect to, e.g., power consumption, operating speed, electromagnetic emission, robustness towards variations in supply voltage, temperature, fabrication process parameters, etc.) as compared to synchronous (clocked) circuits.

On the other hand there are also some drawbacks. Asynchronous circuits usually require a control logic for implementing handshake operations that are necessary to synchronize different circuit elements as a global clock signal does not exist. The asynchronous control logic that implements the handshaking normally represents an overhead in terms of circuit complexity.

Important handshaking components that are commonly used to implement the mentioned handshake operations require that the communication along several (input) channels is mutually exclusive, at least at a point at which two channels are merged into a common channel (see, e.g., Jens Sparsø, ed.: Section 5.8 *"Mutual exclusion, arbitration and metastability,"* in: *PRINCIPLES OF ASYNCHRONOUS CIRCUIT DESIGN—A Systems Perspective*, Kluwer Academic Publishers, 2001). That is, a high-low transition (or vice versa) may only occur in one single channel at a given time. Simultaneous "events" in two or more channels are usually handled by arbiters that use so-called mutex elements to decide which event to process first. However, mutex elements are subject to undesired metastability effects when two events occur simultaneously or almost simultaneously (i.e., within a short time interval).

Particularly when implementing finite state machines (FSMs) concurrently occurring events in different communication channels (e.g., on different signalling lines) may be problematic and appropriate arbitration circuits (arbiters) may be significantly complex. There is a need for an easy-to-synthesize state machine including an arbiter for handling concurrent events in different communication channels.

SUMMARY OF THE INVENTION

An arbiter for processing a plurality of asynchronous data signals is disclosed. Each data signal is associated with a respective request signal and a respective acknowledge signal. In accordance with one example of the invention the arbiter includes a latch array receiving, as input signals, the data signals and request signals and providing, as output signals, a data vector and a corresponding validity vector. The data vector includes values depending on the data signals and the validity vector includes values depending on the request signals when the latch is in a transparent state. The arbiter further includes logic circuitry that is configured to monitor the request signals and to trigger the latch (i.e., to "freeze" the latch output) when any of the request signals becomes active. The logic circuitry is further configured to activate a global request signal a delay time after the latch has been triggered and to selectively activate the acknowledge signals for the channel(s) for which an active request signal has been latched.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIG. 1, which includes

FIG. 2, which includes

FIG. 3, which includes

FIG. 4 illustrates an arbiter for handling a plurality of request signals in one step in accordance with one example of the invention and its application in connection with a finite state machine;

FIG. 5 illustrates one exemplary request generator circuits which may be used in connection with the arbiter of FIG. 4;

DETAILED DESCRIPTION OF ILLUSTRATIVE EMBODIMENTS

Figure 1A:
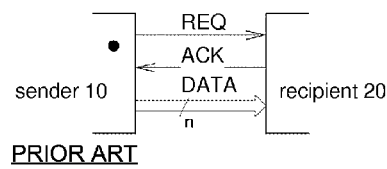
FIGS. 1a and 1b, illustrates the handshake using request and acknowledge signals between a sender and a recipient in an asynchronous circuit.

In asynchronous circuits a global system clock is not required. Handshake operations are used instead for synchronizing different circuit components. FIG. 1a illustrates the data flow from a sender 10 to a recipient 20. A change in of the data signal is signalled by the sender 10 via the request signal REQ and the reception of the data is signalled by the sender by the acknowledge signal ACK. The request and acknowledge signals are "bundled" with the data signals (labelled DATA in FIG. 1) and thus this concept is often referred to as "bundled data." The term bundled data refers to a situation where the data signals use normal Boolean levels to encode information, and where separate request and acknowledge signals are bundled with the data signals.

Figure 1B:
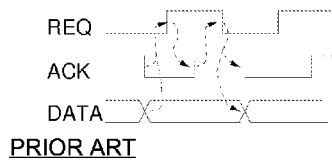

Different handshake protocols are known. The signals labelled DATA should be stable shortly before and while the request signal REQ is active (e.g., REQ=1). FIG. 1b illustrates, as an example, a four-phase protocol wherein the request and acknowledge signals REQ and ACK also use normal Boolean levels to encode information. The term "four-phase" refers to the number of communication actions: (1) the sender 10 issues data (data signals DATA) and sets the request signal REQ to a high level, (2) the recipient 20 receives the data and sets the acknowledge signal ACK to a high level as soon as the data has been properly received or processed, (3) the sender 10 responds by resetting the request signal REQ to a low level (at which point data is no longer guaranteed to be valid), and (4) the recipient 20 acknowledges this by resetting the acknowledge signal ACK to a low level. At this point the sender 10 may initiate the next communication cycle. Although the illustrated handshake protocol is very common, other protocols are also available and appropriate.

The protocol introduced above assumes that the sender 10 is the active party that initiates the data transfer over the channel. This is known as a push channel. The opposite, i.e., the recipient 20 asking for new data, is also possible and is called a pull channel. In this case the directions of the request and acknowledge signals REQ and ACK are reversed, and the validity of data is indicated in the acknowledge signal ACK going from the sender 10 to the recipient 20 (pull channels). In abstract circuit diagrams showing links/channels (like in FIG. 1a) as one symbol the active end of a channel is often marked with a dot. The data signals DATA may be omitted in cases where only synchronization of two circuit components is requires without the need for data exchange. Further the data flow may be bi-directional (push/pull channels). Although the further discussion concentrates on push channels the principles introduced herein may be also applied to pull channels and push/pull channels.

In view of the data exchange and synchronization mechanism illustrated in FIG. 1 it is clear that recipients receiving multiple input channels have to cope with (almost) simultaneously occurring requests (i.e., a transition in the request signal REQ). So-called "mutex elements" (mutex is a portmanteau word of "mutually" and "exclusive") are usually used to ensure that only one request (or, generally, one event) occurring in a specific one of a plurality of signals is forwarded to a receiver.

Figure 2A:
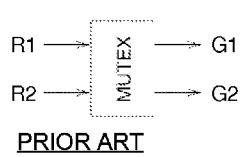
FIGS. 2a and 2b, illustrates one exemplary mutex element.

One exemplary mutex element (labelled MUTEX) is illustrated in FIG. 2. The input signals R1 and R2 are two requests that originate from two independent sources, and the task of the mutex element is to pass these inputs to the corresponding outputs G1 and G2 in such a way that at most one output is active (that is, e.g., at a high level) at any given time. If only one input request arrives the operation is trivial. If one input request arrives well before the other, the latter request is blocked until the first request is de-asserted. The problem arises when both input signals are asserted at the same time. Then the mutex element MUTEX is required to make an arbitrary decision, and this is where metastability enters the picture. As this issue of metastability is well known, it is not further discussed here.

Figure 2B:
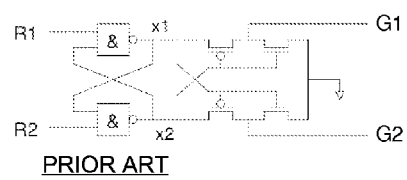

Reference is made to literature (see e.g., Jens Sparsø, ed.: Section 5.8, "Mutual exclusion, arbitration and metastability," in: PRINCIPLES OF ASYNCHRONOUS CIRCUIT DESIGN—A Systems Perspective, Kluwer Academic Publishers, 2001). In the example of FIG. 2b the mutex element is composed of a flip flop (implemented by the two NAND gate) and a metastability filter (implemented by the CMOS transistor circuit) arranged downstream thereof.

Figure 3A:
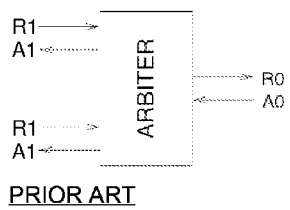
FIGS. 3a and 3b, illustrates an arbiter for handling two request signals directed to the same resource (e.g., recipient)

Mutex elements may be used to implement an arbiter, which can be used to control access to a resource (e.g., one recipient) that is shared between several autonomous independent parties (e.g., several senders). One possible implementation is shown in FIG. 3. As the illustrated arbiter implementation is also well known, only a rough explanation is given here and reference is made to the above-mentioned textbook of J. Sparsø.

Figure 3B:
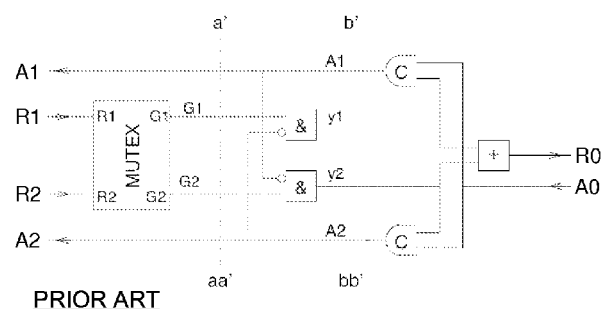

In the example of FIG. 3b the mutex element MUTEX ensures that (request) signals G1 and G2 (at the interface a'-aa') are mutually exclusive. Following the mutex element are two AND gates whose purpose it is to ensure that handshakes on the y1/A1- and y2/A2-channels (at the interface b'-bb') are mutually exclusive. That is, the request signal y2 can only go high if the acknowledge signal A1 is low and the request signal y1 can only go high if the acknowledge signal A2 is low. In this way, if handshaking is in progress along one channel, the arbiter blocks handshaking on the other channel. In cases where more than two inputs are to be handled by the arbiter, the arbiter circuit is significantly more complex. The gate labelled "C" is a Muller C-element which is also extensively discussed in the textbook of J. Sparsø mentioned above.

In cases where the arbiter is used to handle inputs supplied to a finite state machine (FSM) only one input signal can be processed by the FSM at a time instant. Furthermore, when handling a plurality of inputs a large number of mutex elements (e.g., arranged in a chain or a tree structure) are required wherein each mutex element has to cope with the mentioned problems arising from metastability which may significantly slow down the arbiter. In view of this, a novel arbiter has been developed which is able to handle a plurality of input channels thus allowing e.g., a finite state machine (FSM) to process a plurality of "events" (e.g., requests) in a single step. An example of the arbiter is described herein below with reference to FIGS. 4 and 5.

FIG. 4 illustrates a block diagram an asynchronously operating finite state machine 40 (FSM) which receives a plurality of input data signals D0, D1, D2, . . . , Dn, wherein each data signal D0, D1, D2, . . . , Dn, is associated with corresponding request signals R0, R1, R2, . . . , Rn, and acknowledge signals A0, A1, A2, . . . , An, to allow a handshake operation, e.g., as explained with respect to FIG. 1. The input data signals D0, D1, D2, . . . , Dn, and the corresponding request signals request signals R0, R1, R2, . . . , Rn, are not directly supplied to the FSM 40. The data and request signals Di, Ri (whereby i=0, 1, 2, . . . n) are rather supplied to an arbiter 30 which is configured to monitor the request signals Ri of all channels (channel 0 to channel n) simultaneously.

As soon as any request signal becomes active (e.g., assumes a high level) the values of all request and data signals Ri, Di are stored in latches (i.e., in a latch array). For this purpose the arbiter is configured to simultaneously monitor all request signals Ri for transitions (for signals becoming active). When one or more requests are detected and the signal values have been stored in the latch array the arbiter waits for a predefined time span to allow all latches to recover from possible meta-stable states. Finally one global request signal REQ is generated and supplied to the FSM 40. The latched values of the input data signals D0, D1, . . . , Dn are provided to the FSM 40 as data vector $i_{DATA}(0:n)$ wherein an additional data vector $i_{VALID}(0:n)$ is generated (validity vector) and provided to the FSM 40 which indicates the valid data (e.g., the values of those data signals Di for which the corresponding latched request signal is active).

Thus the data vector can be expressed as $i_{DATA}=(D0,D1,D2\ldots,Dn),$ and the additional data vector can be expressed as $i_{VALID}=(R0,R1,R2\ldots,Rn).$ That is, those elements Di of the data vector $i_{DATA}$ are valid for which the corresponding request Ri stored in the additional data vector $i_{VALID}$ is active (e.g., Ri=1). When the FSM has received the data vectors $i_{DATA}$, $i_{VALID}$ a corresponding acknowledge signal ACK is generated and sent back to the arbiter as explained with respect to the general example of FIG. 1. The acknowledge signal ACK is forwarded to those channels for which the an active request signals Ri has been detected, that is Ai=ACK when Ri=active(for i=0,1,2, . . . n).

With an arbiter operating as explained above a plurality of input data signals can be processed simultaneously. Only the requests which are successfully forwarded to the FSM 40 are acknowledged back to the sender. The requests which are not captured are processed in the next "cycle." It should be noted, however, that a fixed cycle period is not required. The arbiter and the FSM rather keep one processing request signals as long as any request signal is active. As a result an automatic processing of not-yet-served events (i.e., active requests which have not yet been processed) is accomplished.

FIG. 5 illustrates a "request generator," which is a circuit 35 configured to generate a request signal in response to an actualisation of the data DATAi (i=0, 1, 2, . . . , n). However, separate request generators are not required when the signal source (or sources) that provides the data signals DATAi is capable of providing appropriate request signals corresponding to the data. It should be noted that DATAi may represent a single bit signal or an n-bit signal, e.g., a strobe signal associated with a data word of several bits. One exemplary implementation of the request generator is discussed further below with reference to FIG. 8.

Figure 6:
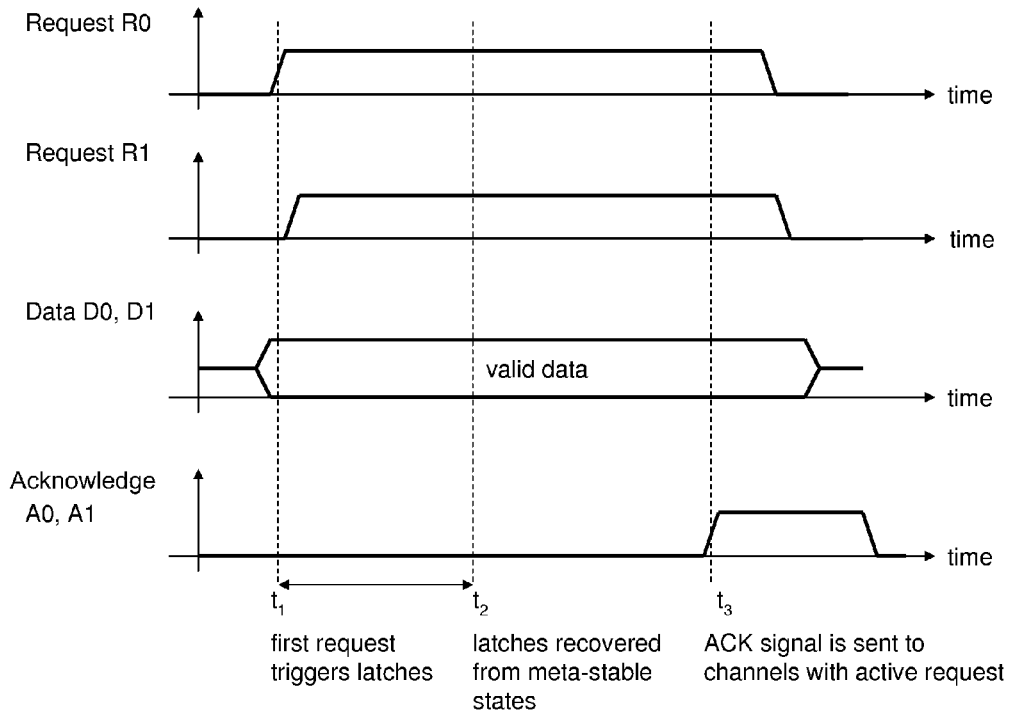
FIG. 6 provides timing diagrams illustrating the function of the arbiter of FIG. 4.

FIG. 6 illustrates the relevant signals (request, data, and acknowledge signals) processed by an arbiter 30 as explained above with reference to FIG. 4. In the present example only two data signals D0 and D1 and two corresponding request signal R0 and R1 as well as two corresponding acknowledge signals A0 and A1 are considered. It should be noted that the data signals D0 and D1 can be considered valid when the corresponding request signals R0 and R1 become active. The two upper diagrams of FIG. 6 illustrate the request signals R0, R1 wherein both requests (rising edges) arrive at the arbiter almost concurrently. The request R1 arrives, however, a little bit later and thus request R0 triggers the latch array at a time instant $t_1$. The arbiter then forwards the latched data and request signals to a subsequent circuit (e.g., the FSM 40 in the example of FIG. 4). To avoid meta-stability effects a predefined delay $t_2-t_1$ is waited before generating the "global" request signal REQ (see FIG. 4) which is supplied to the recipient of the data (e.g., the FSM 40). The recipient (e.g., the FSM 40) generates the acknowledge signal ACK when the data has been correctly received. The signal ACK is distributed to the channels for which an active request signal has been captured in the latch array; in the present example of FIG. 6 the ACK signal is distributed to the channels 0 and 1 as signals A0 and A1.

Figure 7:
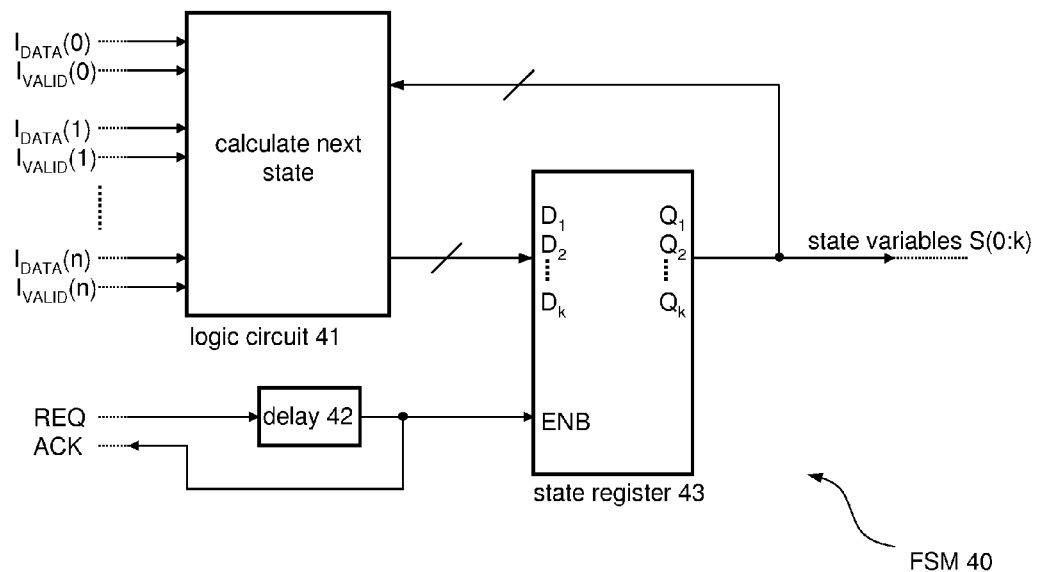
FIG. 7 illustrates one exemplary implementation of the state machine illustrated in the example of FIG. 4.

FIG. 7 illustrates an exemplary implementation of a finite state machine (FSM) 40 which may be used in connection with the arbiter 30 as shown in the example of FIG. 4. The FSM illustrated here is a Mealy-type state machine and includes a logic circuit 41 which is configured to calculate updated state variables S'(0:k) from the current state variables S(0:k) and the inputs given by the vector $i_{VALID}$(0:n), that is S'(0:k)=f(S(0:k), $i_{VALID}$(0:n)). When the calculation is completed, then the updated state variables S'(0:k) are latched in the state register 43 and thus become the actual state variables S(0:k) which can also be seen as output of the FSM. The latching of the updated state variables S'(0:k) is triggered by a delayed version ENB of the request signal REQ provided by the arbiter 30 (see FIG. 4) wherein the delay (see delay element 42) between the signals REQ and ENB is designed such that the calculation of the updates state variables S'(0:k) has been completed before the signal ENB becomes active and triggers the state register (which can be seen as latch array). The delayed version ENB of the request signal REQ is also supplied back to the arbiter as acknowledge signal ACK to signal that the data vector $i_{VALID}$(0:n) has been successfully processed and the FSM is ready to receive new data. It should be noted that the implementation presented here is regarded as an example and, e.g., a Muller pipeline may be used to store instead of a flip-flop-based state register.

Figure 8:
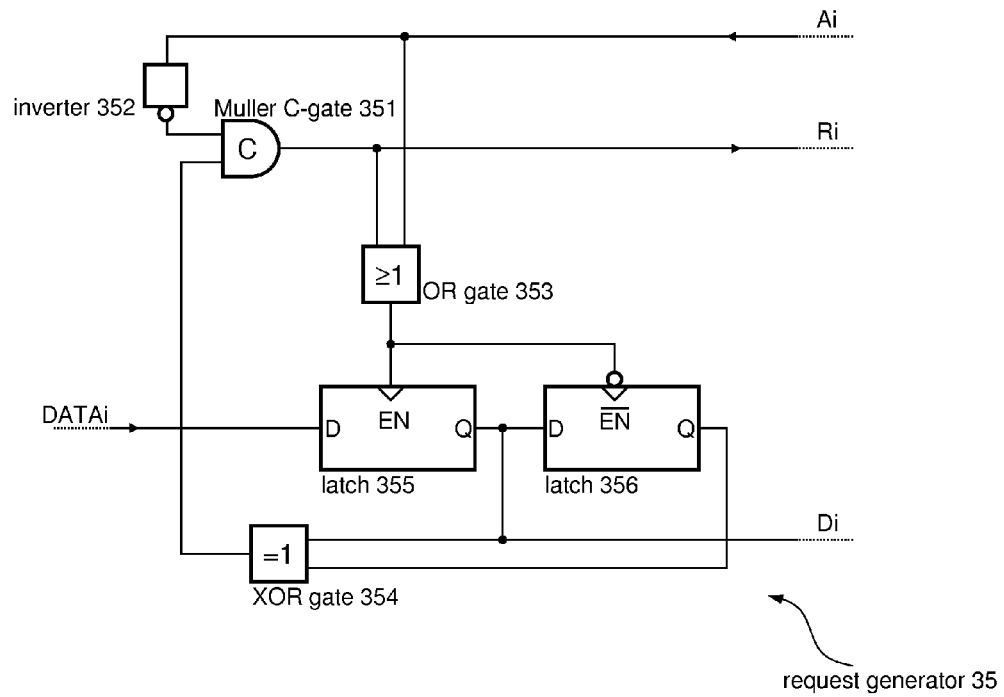
FIG. 8 illustrates one exemplary implementation of the request generator circuit (requestor) of FIG. 5.
Figure 9:
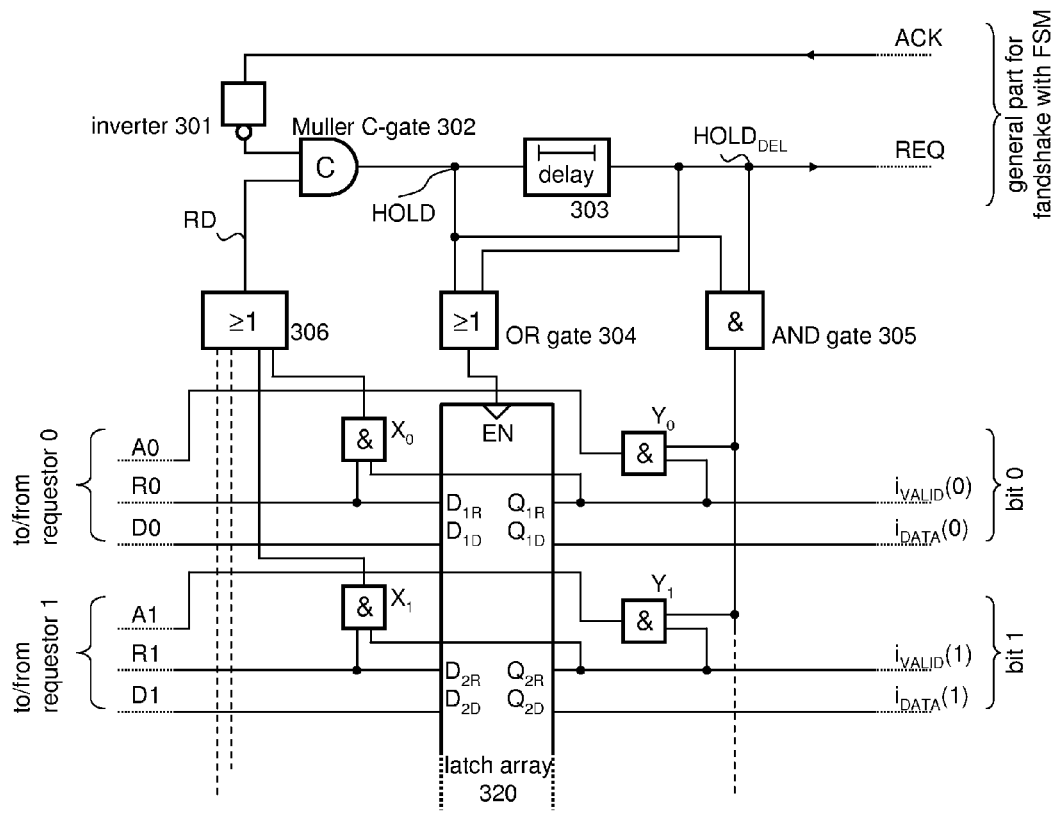
FIG. 9 illustrates one exemplary implementation of the arbiter of FIG. 4.

FIGS. 8 and 9 illustrate exemplary implementations of the request generator circuit 35 of FIG. 5 and the arbiter 40 of FIG. 4, respectively. The request generator circuit 35 receives an input data signal DATAi (e.g., a 1-bit signal in the present example) and provides a corresponding pair of request signal Ri and output data signal Di in response to a transition (high to low and low to high) in the input data signal DATAi. When the request signal Ri is active upon a transition of the input data signal DATAi, then each subsequent transitions are ignored until an acknowledge signal Ai is received. The data signal DATAi is not necessarily a 1-bit signal but may also be a multi-bit signal including a n parallel bits.

FIG. 8 illustrates one exemplary implementation of the request generator 35 depicted in FIG. 5. In a stable state (initiated, e.g., by a signal Ai=1) the output of the OR gate 353 is active (e.g., at a high level) and thus latch 355 is transparent while the latch 356 is in "hold state" (i.e., maintaining the output irrespective of the input). As a result the input data signal DATAi can propagate through the latch 355 and is directly available as data signal Di. The outputs of the two latches 355 and 356 are both supplied as inputs to the XOR gate 354. In the stable state the output of the XOR gate 354 is inactive (i.e., at a low level). However, when the input data DATAi changes its level (i.e., when an edge occurs in the signal DATAi) the output of the transparent latch 355 also changes while the output of the opaque latch 356 is maintained, and thus the output of the XOR gate 354 becomes active (i.e., changes to a high level).

The active output of the XOR gate 354 triggers the Muller C-gate 351 and thus the request signal Ri also becomes active. In such a manner the edge in the input data signal DATAi generates a request. The active request signal Ri causes (via the OR gate 353) the latch 355 to change to a hold state while the latch 356 becomes transparent. At that time the outputs of the two latches are, again, equal and thus the output of the XOR gate 354 returns to an inactive state (low level). When receiving the acknowledge signal Ai the Muller C-gate 351 is again triggered (via inverter 352) and the latches 355 and 356 again change their state (latch 355 becoming transparent and latch 356 holding its output) as the acknowledge signal Ai is forwarded via the OR gate 353 to the latches. At this point the request generator is "free" to again monitor the data signal DATAi and generate the next request upon observing the next edge in the data signal DATAi.

It should be noted that the request generator 35 is configured to generate the data output signal Di a little bit earlier than the corresponding request Ri to allow the arbiter to reliably capture the data Di. This time difference is due to the propagation delay caused by the XOR gate 354 and the Muller C-gate 351.

The arbiter 40 illustrated in FIG. 9 latches the request signals R0, R1, etc. and the data signals D0, D1, etc. in the multi-channel latch 320. The latch is transparent when the enable signal is low (EN=0). In this case the output vector $i_{VALID}$ includes the request signals (i.e., $i_{VALID}$={R0, R1, . . . , Rn}) and the output vector $i_{DATA}$ includes the data signals (i.e., $i_{DATA}$={D0, D1, . . . , Dn}). In response to the first request signal Ri that becomes active the latch is triggered (enable signal EN=1), the output values (i.e., the values of the output vectors $i_{VALID}$ and $i_{DATA}$) are "frozen," and the global request signal REQ is generated. The latch 320 is not disabled (i.e., set transparent) until an acknowledge signal ACK is received. A typical signal sequence (i.e., one request-acknowledge-cycle) is described below to illustrate the function of the arbiter of FIG. 9.

Just for illustrative purposes it is assumed that all request and acknowledge signals Ri, Ai, REQ, ACK are initially inactive (Ri=0 and Ai=0 for all relevant values of i, REQ=0, ACK=0). Furthermore, the hold signal HOLD (output of the Muller C-gate 302) is also initially inactive (HOLD=0) and thus the latch-array 320 is transparent. In this situation, the values of the input data signals are not relevant, the output data vector $i_{VALID}$ contains the current values of the input data signals (i.e., $i_{DATA}$={D0, D1, . . . , Dn}) which is a result of the latch array 320 being transparent.

For the further discussion it is assumed that one of the input data signals and the corresponding request signal becomes active (e.g., D0=1 and, a very short time later, R0=1). As a result of the latch array 320 being transparent the values are forwarded to the latch output and thus $i_{VALID}(0)$ and $i_{DATA}(0)$ become active ($i_{VALID}(0)$=R0=1 and $i_{DATA}(0)$=D0=1). This result causes the output of the AND gate $X_0$ to become active. As the outputs of the AND gates X0, X1, etc. are all supplied (as inputs) to the or gate 306 the output RD of the OR gate 306 becomes active if at least one of the AND gates detects an active request signal (RD is short for "request detected"). That is RD=1 if (and only if) at least one of the request signals Ri is active.

If at least one request is detected (RD=1) then the Muller C-gate 302 switches its output signal HOLD to a high level (HOLD=1). A defined delay time $T_D$ later the delayed HOLD signal $HOLD_{DEL}$ also becomes active (delay element 303). An active HOLD signal also triggers (i.e., closes) the latch via the OR gate 304. As a consequence the latch array outputs $i_{VALID}(0:n)$ and $i_{DATA}(0:n)$ are "frozen" and changes at the latch array inputs have no effect on the output vectors any more.

One of the other latch inputs (i.e., Ri and/or Di, with i>0 in the present example) might have "seen" a transition at the time the latch array 320 has been triggered. In this case the latch array outputs may have become meta-stable. For this reason no action should be taken until these possibly meta-stable latches have recovered. A defined recovery time is ensured by the delay element 303 so that the latches of the latch array 320 have a time $T_D$ for recovering from meta-stable states.

The delayed HOLD signal $HOLD_{DEL}$ is then (after the delay time $T_D$ has elapsed) output as global request signal REQ. At the time the global request signal becomes active, the output of the AND gate 305 becomes active, too, as both signals HOLD and $HOLD_{DEL}$ are now active. As a consequence, all requestors for which an active request signal (in the present example only R0 or $i_{VALID}(0)$, respectively) has been "caught" in the latch array receive a a corresponding active acknowledge signal (in the present example only signal A0) via the AND gates Yi (i=0, 1, . . . n). This can be seen as selective acknowledge for all channel x for which $i_{VALID}(x)$ is active. Upon receiving the (selective) acknowledge signals Ai the corresponding requestors (in the present example the requestor 0) will disable their request signals Ri.

When the FSM that received and processed the arbiter's output vectors $i_{VALID}(0:n)$ and $i_{DATA}(0:n)$ answers by activating the global acknowledge signal ACK the Muller C-gate 302 (which receives the ACK signal via the inverter 301) deactivates its output (HOLD=0). Furthermore, the selective acknowledge signals Ai are deactivated via the AND gate 305 and the AND gates Yi (i=0, 1, . . . n). A delay time TD later the global request REQ (corresponds to $HOLD_{DEL}$) is also deactivated, what causes the latch array 320 to become transparent again (enable signal EN is set to 0 via OR gate 304). In this situation the arbiter is idle and ready to process further requests occurring at any input channel (from any requestor).

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. An arbiter for processing a plurality of asynchronous data signals, wherein each data signal is associated with a respective request signal and a respective acknowledge signal, the arbiter comprising:
    a latch array comprising a plurality of individual latches, an input coupled to receive the data signals and request signals as input signals, and an output coupled to provide a data vector and a validity vector as output signals, the data vector including values depending on the data signals and the validity vector including values depending on the request signals when the latch array is in a transparent state; and
    logic circuitry that is configured to:
        monitor the request signals and trigger the latch array when any of the request signals becomes active;
        activate a global request signal a delay time after the latch has been triggered; and
        selectively activate the acknowledge signals for a channel or channels for which an active request signal has been latched.

2. The arbiter of claim 1, wherein the latch array comprises one latch for each received data signal and for each received request signal, and wherein the logic circuitry is configured to trigger the latch array by setting the individual latches of the latch array from a transparent state to a hold state.

3. The arbiter of claim 2, wherein the logic circuitry is further configured to:
    receive a global acknowledge signal; and
    deactivate the global request signal, when the global acknowledge signal is received.

4. The arbiter of claim 3, wherein the logic circuitry is configured to deactivate the global request signal a delay time after the global acknowledge signal is received.

5. The arbiter of claim 2, wherein the logic circuitry is further configured to:
   receive a global acknowledge signal; and
   reset the individual latches of the latch array from the hold state to the transparent state, when receiving the acknowledge signal.

6. The arbiter of claim 5, wherein the logic circuitry is configured to reset the latches a delay time after the global acknowledge signal is received.

7. The arbiter of claim 1, wherein the request signals, the acknowledge signals, and/or the global request signal are at a first logic level when active and at a second logic level when inactive or deactivated.

8. A system comprising:
   a finite state machine (FSM) configured to process at least two asynchronous data signals; and
   an arbiter configured to receive the asynchronous data signals and corresponding request signals and to provide respective acknowledge signals, wherein the arbiter comprises:
      a latch array configured to receive the data signals and the corresponding request signals as input signals, and configured to provide a data vector and a validity vector as output signals to the FSM, the data vector including values depending on the data signals and the validity vector including values depending on the request signals when the latch array is in a transparent state; and
      logic circuitry that is configured to:
         monitor the request signals and trigger the latch array when any of the request signals becomes active;
         activate a global request signal a delay time after the latch has been triggered, the global request signal being provided to the FSM; and
         selectively activate the acknowledge signals for a channel or channels for which an active request signal has been latched when receiving a global acknowledge signal from the FSM.

9. The system of claim 8, further comprising a logic unit configured to receive the data vector, the validity vector and a vector of state variables of the FSM and to calculate updated state variables using the state variables and those values of the data vector for which the corresponding values of the validity vector indicates the data is valid.

10. The system of claim 9, further comprising a state register coupled to the logic circuitry.

11. An arbitration method for processing a plurality of asynchronous data signals, wherein each data signal is associated with a respective request signal and a respective acknowledge signal, the method comprising:
   monitoring the request signals;
   capturing current values of the request signals and the corresponding data signals in a latch when any of the request signals becomes active;
   activating a global request signal a delay time after the latch has been triggered:
   outputting the global request signal and the latched request signal and data signal values;
   receiving, monitoring, and assessing a global acknowledge signal; and
   selectively activating the acknowledge signals for a channel or channels for which an active request signal has been latched, when the global acknowledge signal is assessed as active.

12. The method of claim 11, wherein capturing the current values in the latch comprises storing the current values in a latch array.

13. The method of claim 12, wherein the latch array comprises one latch for each received data signal and for each received request signal, and wherein capturing the current values comprises setting the individual latches of the latch array from a transparent state to a hold state.

14. The method of claim 11, further comprising deactivating the global request signal when the global acknowledge signal is received.

15. The method of claim 14, wherein where and deactivating the global request signal comprises deactivating the global request signal a delay time after the global acknowledge signal is received.

16. The method of claim 11, wherein the request signals, the acknowledge signals, and/or the global request signal are at a first logic level when active and at a second logic level when inactive or deactivated.

* * * * *